United States Patent
Zeng et al.

(10) Patent No.: US 7,477,197 B2
(45) Date of Patent: Jan. 13, 2009

(54) PACKAGE LEVEL INTEGRATION OF ANTENNA AND RF FRONT-END MODULE

(75) Inventors: Xiang Yin Zeng, Shanghai (CN); Jiangqi He, Gilbert, AZ (US); Guizhen Zheng, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/618,046

(22) Filed: Dec. 29, 2006

(65) Prior Publication Data

US 2008/0158063 A1    Jul. 3, 2008

(51) Int. Cl.
*H01Q 1/38* (2006.01)

(52) U.S. Cl. .............. 343/700 MS; 333/247; 333/24 C

(58) Field of Classification Search .......... 343/700 MS, 343/702, 846, 853; 333/247, 24 C, 24 R; 257/659, 686, 691
See application file for complete search history.

(56) References Cited

U.S. PATENT DOCUMENTS

| | | | |
|---|---|---|---|
| 5,973,568 A | 10/1999 | Shapiro et al. | 330/295 |
| 6,181,278 B1 * | 1/2001 | Kakimoto et al. | 343/700 MS |
| 6,388,623 B1 * | 5/2002 | Sakota et al. | 343/700 MS |
| 6,809,688 B2 * | 10/2004 | Yamada | 343/700 MS |
| 7,016,654 B1 | 3/2006 | Bugeja | 455/73 |
| 7,081,862 B2 | 7/2006 | Tsai | 343/772 |
| 7,110,741 B2 * | 9/2006 | Knopik et al. | 455/333 |
| 7,145,511 B2 * | 12/2006 | Tang et al. | 343/700 MS |
| 7,148,751 B2 | 12/2006 | Weigand et al. | 330/307 |
| 7,236,070 B2 * | 6/2007 | Ajioka et al. | 333/247 |
| 2005/0030231 A1 * | 2/2005 | Nagaishi et al. | 343/700 MS |
| 2007/0001260 A1 | 1/2007 | Zeng et al. | 257/532 |
| 2007/0158818 A1 | 7/2007 | Tang et al. | 257/691 |
| 2008/0146150 A1 | 6/2008 | Luo et al. | 455/41.2 |
| 2008/0157294 A1 | 7/2008 | Zeng et al. | 257/659 |
| 2008/0157322 A1 | 7/2008 | Tang et al. | 257/686 |

* cited by examiner

*Primary Examiner*—Hoang V Nguyen
(74) *Attorney, Agent, or Firm*—Konrad Raynes & Victor, LLP; Alan S. Raynes

(57) ABSTRACT

Electronic devices and methods for their formation are described. One device relates to an electronic assembly including a substrate having a first surface and a second surface opposite the first surface. The electronic assembly also includes at least one RF front-end module coupled to the first surface of the substrate, and a ground plane layer positioned on the second surface of the substrate. The electronic assembly also includes an insulating layer on the ground plane layer, with the ground plane layer positioned between the second surface and the insulating layer. In addition, the electronic assembly also includes an antenna layer on the insulating layer, with the insulating layer positioned between the antenna layer and the ground plane layer.

20 Claims, 3 Drawing Sheets

PACKAGE LEVEL INTEGRATION OF ANTENNA AND RF FRONT-END MODULE

RELATED ART

Wireless electronic devices continue to shrink in size while providing increased performance. FIG. 1 illustrates a conventional RF (radio frequency) circuit board 10 for a device such as a mobile telephone. The circuit board 10 includes a plurality of elements coupled thereto, including a processor 12, RFIC (radio frequency integrated circuit) 14, FEM (front-end module) transmitter 16, FEM receiver 18, and antenna 20. An interface 22 is also provided. The FEM's need EM (electromagnetic) shielding to prevent problems due to EMI (electromagnetic interference) and EMC (electromagnetic compatibility). Typically, the FEMs include a cover shield taking the form of a metal box on the RF board 10.

FIG. 2 illustrates a cross-sectional view of a conventional FEM structure 25, which is a multi-chip module including a plurality of components 26, 28, 30, 32 mounted to a substrate 24. These FEM components 26, 28, 30, 32 may include, but are not limited to, transistor and low noise amplifier structures. The FEM 18 includes a shield box 33 to provide EM shielding. The shield box 33 is typically formed from a metal. The FEM 18 is coupled to the circuit board 10 using a suitable method, for example, through a plurality of solder bumps 36. Pads 38 may be formed on the opposite surface of the substrate 24 than the FEM components 26, 28, 30, for coupling the FEM 18 to the circuit board 10.

BRIEF DESCRIPTION OF THE DRAWINGS

Embodiments are described by way of example, with reference to the accompanying drawings, which are not drawn to scale, wherein.

DETAILED DESCRIPTION

Certain embodiments relate to the formation of a variety of electronic assemblies. Such assemblies may include those found in wireless devices. Such assemblies may include RF components that should be shielded to minimize problems due to electromagnetic interference and electromagnetic compatibility.

Figure 1:
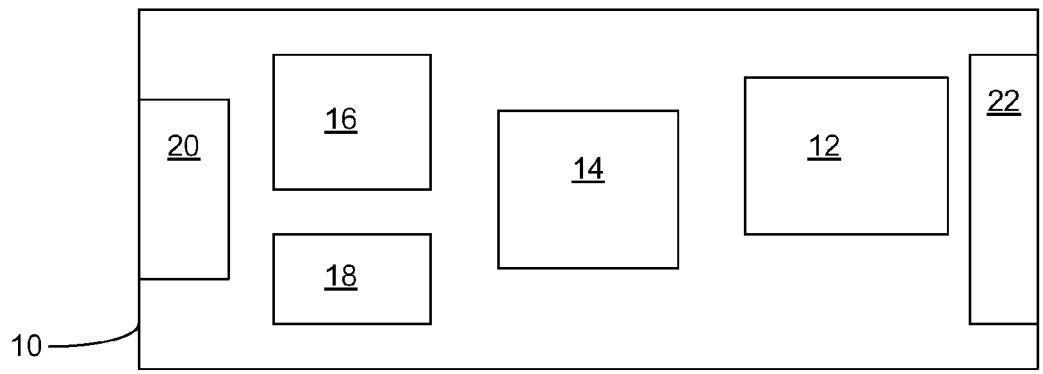
FIG. 1 illustrates a conventional RF board having components thereon, including a processor, RFIC, FEMs, and antenna.
Figure 2:
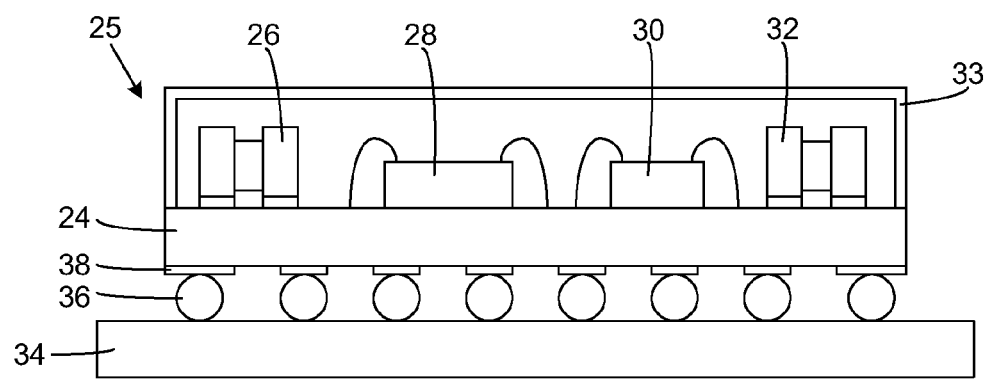
FIG. 2 illustrates a cross sectional view of an FEM coupled to a circuit board in a conventional arrangement.
Figure 3:
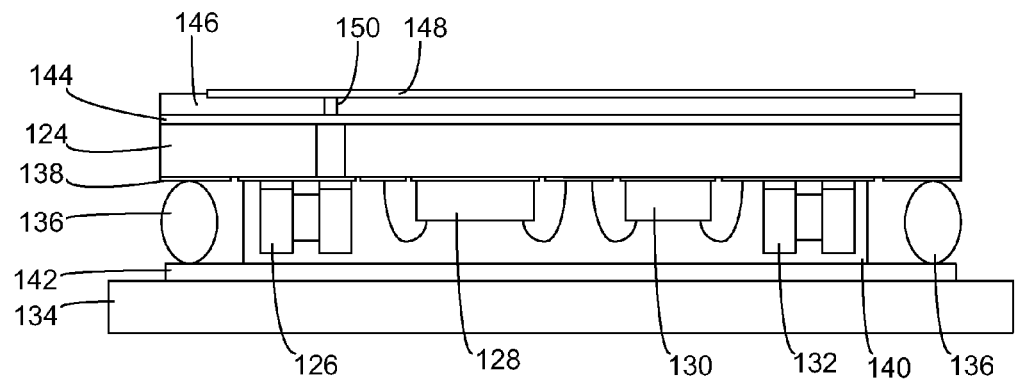
FIG. 3 illustrates a cross sectional view of an FEM coupled to a circuit board, in accordance with certain embodiments.
Figure 4:
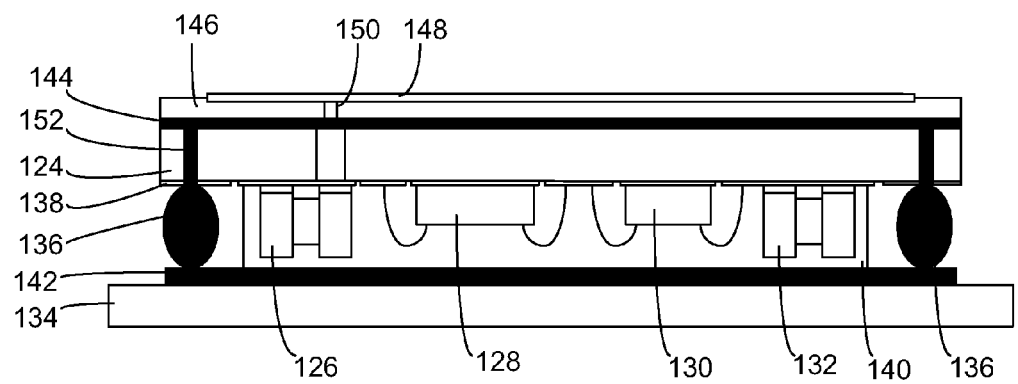
FIG. 4 illustrates a cross sectional view of an FEM coupled to a circuit board, further illustrating the position of a RF shield formed integral thereto, in accordance with certain embodiments.

The embodiment illustrated in FIGS. 3-4 integrates an antenna and an RF FEM into the same package substrate. The assembly includes a substrate 124. The substrate 124 may in certain embodiments be a multi-layer organic substrate. As illustrated in FIGS. 3-4, FEM components 126, 128, 130 and 132 are coupled to the lower surface of the substrate 124. Pad regions 138 may be formed on the substrate. The pad regions 138 may be formed from one or more metals, including, but not limited to, copper. The assembly also includes a circuit board 134, which may be a variety of boards, including, but not limited to, a mother board. A ground plane layer 142 may be formed on the circuit board 134. The ground plane layer 142 may be formed from one or more metals, including, but not limited to, copper. The substrate 124 may be coupled to the circuit board using a variety of techniques, including, but not limited to, bump bonding. As illustrated in FIGS. 3-4, a plurality of solder bumps 136 are positioned between the substrate 124 and circuit board 134, then heated to reflow form a bond between the substrate 124 and circuit board 134. An underfill material 140 may be introduced into the gap between the substrate 124 and circuit board 134, using a method such as a capillary filling method.

As illustrated in FIG. 3, the substrate 124 includes a ground plane layer 144 formed thereon, and an electrically insulating layer 146 formed on the ground plane layer. The ground plane layer may be formed from one or more metals, including, but not limited to, copper. An antenna 148 is formed on the insulating layer 146. The antenna 148 may be a planar antenna and may have a variety of forms, including, but not limited to, a patch antenna, an antenna array, and a zig-zag form dipole antenna. The antenna may be excited using a suitable method, including, but not limited to, a microstrip line, or coupled using a slot. The antenna 148 may be coupled to one or more of the FEM components 126, 128, 130, 132 through feed point 150. The feed point 150 is formed so that the electrical connection between the antenna and the FEM is insulated from the ground plane 144.

Shielding the FEM (including components 126, 128, 130, 132) may be carried out by coupling the ground plane 144 formed on the substrate 124 to the ground plane 142 formed on the board 134, through the vias 152 and solder bumps 136, as illustrated in FIG. 4. As seen in FIG. 4, the vias 152 extend from the ground plane 144 to a lower surface of the substrate 144, where bonding pads 138 are coupled to the solder bumps 136. The vias 152 include an electrically conducting material therein, such as a metal. As seen in bold in FIG. 4, the ground planes 144 and 142 coupled together through the vias 152 and solder bumps 136, act as a ground box to shield the FEM active components. As a result, a metal cover such as used in conventional structures is not needed to shield the FEM.

Devices such as described above in connection with FIGS. 3-4 may have certain advantages in one or more of size, performance, and cost, as a result of the configuration. For example, by eliminating the presence of a separate metal box to shield the FEM's and by incorporating the antenna into the substrate, certain dimensions of the assembly may be made smaller. In addition, the cost may be lowered due to eliminating the cost of the metal box and in more efficient processing (for example, processing the ground plane and antenna by forming layers on the substrate may be simpler and cheaper than utilizing a separate antenna and box as in conventional structures). Moreover, embodiments may also allow for simpler routing on the board. Furthermore, the formation of a ground plane between antenna and the active components inhibits interference between them. Performance may also be improved due to the reduced distance between the antenna and the active devices.

Figure 5:
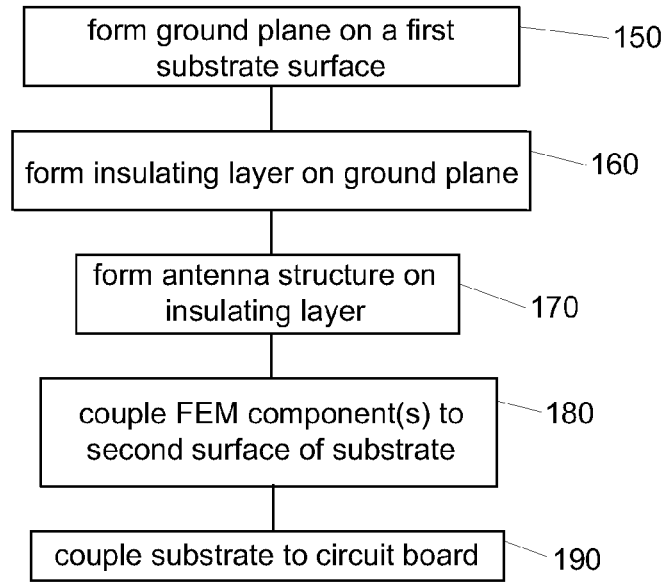
FIG. 5 is a flow chart of certain operations for providing an FEM coupled to a circuit board, in accordance with certain embodiments.

FIG. 5 is a flow chart showing a number of operations in accordance with certain embodiments. Box 150 is forming a ground plane on a first surface of a substrate. The ground plane may be formed from a metal. Box 160 is forming an insulating layer on the ground plane, where the ground plane is positioned between the substrate and the first surface of the substrate. Box 170 is forming an antenna on the insulating layer. The antenna may in certain embodiments be a planar antenna formed from a metal. Box 180 is coupling one or more FEM components to a second surface of the substrate. The second surface may be the opposite facing surface from the first surface. The substrate may be formed with one or more electrically conductive vias. The antenna is electrically coupled to one or more of the FEM components. Box 190 is coupling the substrate to a circuit board, with the second surface of the substrate (the surface on which the FEM components are mounted) facing the circuit board.

Figure 6:
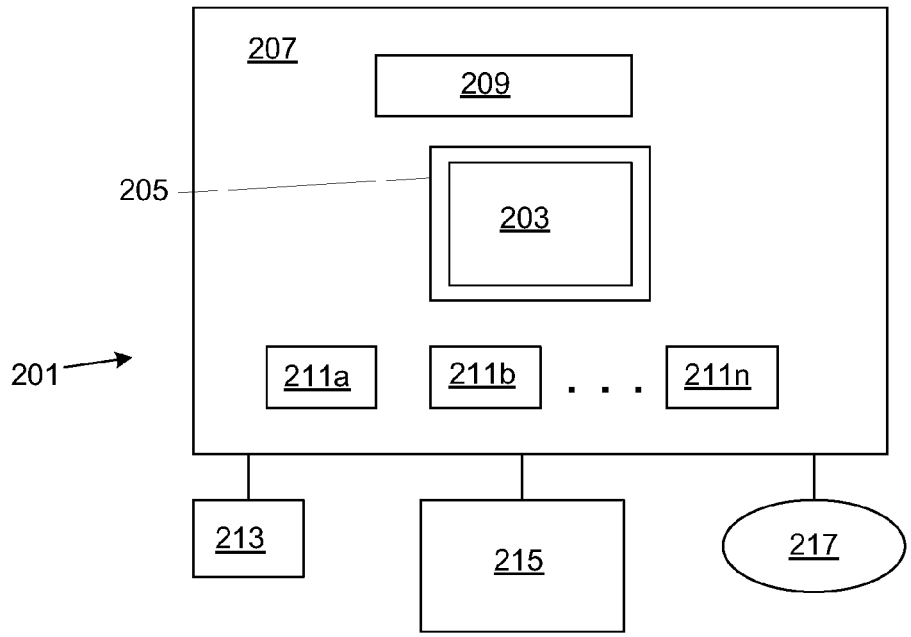
FIG. 6 illustrates an electronic system arrangement in which certain embodiments may find application.

Assemblies including a substrate, FEM, and antenna as described in embodiments above may find application in a variety of electronic components, including, for example, mobile phones and other wireless receiving and/or transmitting products. FIG. 6 schematically illustrates one example of an electronic system environment in which aspects of described embodiments may be embodied. Other embodiments need not include all of the features specified in FIG. 6, and may include alternative features not specified in FIG. 6.

The system 201 of FIG. 6 may include at least one central processing unit (CPU) 203. The CPU 203, also referred to as a microprocessor, may be a die which is attached to an integrated circuit package substrate 205, which is then coupled to a printed circuit board 207, which in this embodiment, may be a motherboard. The package substrate 205 is an example of an electronic device assembly that may have a structure formed in accordance with embodiments such as described above. A variety of other system components, including, but not limited to, a wireless communications controller and other components discussed below, may also include assembly structures formed in accordance with the embodiments described above.

The system 201 further may further include memory 209 and one or more controllers 211*a*, 211*b* . . . 211*n*, which are also disposed on the motherboard 207. The motherboard 207 may be a single layer or multi-layered board which has a plurality of conductive lines that provide communication between the circuits in the package 205 and other components mounted to the board 207. Alternatively, one or more of the CPU 203, memory 209 and controllers 211*a*, 211*b* . . . 211*n* may be disposed on other cards such as daughter cards or expansion cards. The CPU 203, memory 209 and controllers 211*a*, 211*b* . . . 211*n* may each be seated in individual sockets or may be connected directly to a printed circuit board. A display 215 may also be included.

Any suitable operating system and various applications execute on the CPU 203 and reside in the memory 209. The content residing in memory 209 may be cached in accordance with known caching techniques. Programs and data in memory 209 may be swapped into storage 213 as part of memory management operations. The system 201 may comprise any suitable computing device, including, but not limited to, a mainframe, server, personal computer, workstation, laptop, handheld computer, handheld gaming device, handheld entertainment device (for example, MP3 (moving picture experts group layer—3 audio) player), PDA (personal digital assistant) telephony device (wireless or wired), network appliance, virtualization device, storage controller, network controller, router, etc.

The controllers 211*a*, 211*b* . . . 211*n* may include one or more of a system controller, peripheral controller, memory controller, hub controller, I/O (input/output) bus controller, video controller, network controller, storage controller, wireless communications controller, etc. For example, a storage controller can control the reading of data from and the writing of data to the storage 213 in accordance with a storage protocol layer. The storage protocol of the layer may be any of a number of known storage protocols. Data being written to or read from the storage 213 may be cached in accordance with known caching techniques. A network controller can include one or more protocol layers to send and receive network packets to and from remote devices over a network 217. The network 217 may comprise a Local Area Network (LAN), the Internet, a Wide Area Network (WAN), Storage Area Network (SAN), etc. Embodiments may be configured to transmit and receive data over a wireless network or connection. In certain embodiments, the network controller and various protocol layers may employ the Ethernet protocol over unshielded twisted pair cable, token ring protocol, Fibre Channel protocol, etc., or any other suitable network communication protocol.

While certain exemplary embodiments have been described above and shown in the accompanying drawings, it is to be understood that such embodiments are merely illustrative and not restrictive, and that embodiments are not restricted to the specific constructions and arrangements shown and described since modifications may occur to those having ordinary skill in the art.

What is claimed:

1. An electronic device comprising:
   a printed circuit board;
   a first ground plane layer on the surface of the printed circuit board;
   a plurality of bumps coupled to the first ground plane layer;
   a substrate having a first surface that faces the first ground plane layer, the substrate first surface being coupled to the first ground plane through the bumps;
   a gap between the substrate first surface and the first ground plane;
   at least one radio frequency front-end module coupled to the first surface of the substrate and positioned so that the radio frequency front-end module extends into the gap;
   a second ground plane layer formed on a second surface of the substrate opposite the first surface of the substrate;
   an insulating layer positioned on the second ground plane layer; and
   an antenna positioned on the insulating layer and electrically isolated from the second ground plane layer, wherein the second ground plane layer is positioned between the antenna and the substrate.

2. The electronic device of claim 1, wherein the first ground plane layer is electrically coupled to the second ground plane layer, and wherein the electrically coupled ground plane layers comprise a electrically conducting shield around the at least one radio frequency front-end module.

3. The electronic device of claim 2, wherein the antenna is a planar antenna formed to extend parallel to the second ground plane layer.

4. The electronic device of claim 2, further comprising a plurality of vias extending through the substrate and an electrically conductive material in the vias to electrically couple the second ground plane to the bumps.

5. The electronic device of claim 1, wherein the substrate is a multi-layer organic substrate.

6. The electronic device of claim 1, further comprising an encapsulant positioned in the gap.

7. The electronic device of claim 1, wherein the first ground plane layer and the second ground plane layer each comprise copper.

8. The electronic device of claim 1, wherein the first ground plane layer is electrically coupled to the second ground plane layer through the bumps.

9. An electronic device comprising:
a substrate having a first surface and a second surface opposite the first surface;
at least one RF front-end module coupled to the first surface of the substrate;
a ground plane layer positioned on the second surface of the substrate;
an insulating layer on the ground plane layer, the ground plane layer positioned between the second surface and the insulating layer;
an antenna layer on the insulating layer, the insulating layer positioned between the antenna layer and the ground plane layer; and
a circuit board to which the substrate is coupled.

10. The electronic device of claim 9, wherein the circuit board comprises a motherboard.

11. The electronic device of claim 9, further comprising a plurality of electrically conductive bumps coupling the substrate to the circuit board.

12. The electronic device of claim 11, further comprising a ground plane layer on the printed circuit board, wherein the ground plane layer on the circuit board is electrically coupled to the ground plane layer on the substrate.

13. The electronic device of claim 12, wherein the ground plane layer on the circuit board is electrically coupled to the ground plane layer on the substrate through the electrically conductive bumps.

14. The electronic device of claim 11, wherein the at least one RF front-end module extends a distance outward from the first surface of the substrate, and wherein the electrically conductive bumps extend a distance outward from the first surface that is greater than the distance that the at least one RF front-end module extends outward from the first surface of the substrate.

15. A method for forming an electronic device, comprising:
providing a substrate having a first surface and a second surface opposite the first surface, the substrate including a ground plane layer on the second surface, an insulating layer on the ground plane layer, and an antenna on the insulating layer, wherein the ground plane layer is positioned between the substrate first surface and the antenna;
coupling at least one radio frequency front-end module to the first surface of the substrate;
coupling the substrate to a circuit board using a plurality of bumps coupled to a ground plane layer on the circuit board;
wherein the substrate is positioned so that the first surface of the substrate faces the circuit board;
wherein the ground plane layer on the substrate is electrically coupled to the ground plane layer on the circuit board; and
wherein the device is configured so that the at least one radio frequency front-end module is electrically shielded by the ground plane layers on the substrate and circuit board and the electrical coupling therebetween.

16. The method of claim 15, further comprising forming electrical connections between the ground plane in the substrate to the ground plane in the circuit board through a plurality of vias in the substrate and through the bumps.

17. The method of claim 15, wherein the device is configured so that the at least one radio frequency front-end module is electrically shielded by the ground plane layers on the substrate and circuit board and the electrical coupling therebetween.

18. An electronic device comprising:
a substrate having a first surface and a second surface opposite the first surface;
at least one RF front-end module coupled to the first surface of the substrate;
a ground plane layer positioned on the second surface of the substrate;
an insulating layer on the ground plane layer, the ground plane layer positioned between the second surface and the insulating layer;
an antenna layer on the insulating layer, the insulating layer positioned between the antenna layer and the ground plane layer; and
a plurality of electrically conductive bumps positioned on the first surface, the bumps being electrically coupled to the ground plane layer, wherein the first surface is positioned between the bumps and the second surface.

19. The electronic device of claim 18, wherein the at least one RF front-end module extends a distance outward from the first surface of the substrate, and wherein the electrically conductive bumps extend a distance outward from the first surface that is greater than the distance that the at least one RF front-end module extends outward from the first surface of the substrate.

20. The electronic device of claim 19, further comprising a bonding pad layer positioned between the electrically conductive bumps and the first surface of the substrate.

* * * * *